(12) United States Patent
Cha et al.

(10) Patent No.: US 11,830,860 B2
(45) Date of Patent: Nov. 28, 2023

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Hyun Goo Cha, Incheon (KR); Dong Hee Kang, Gyeonggi-Do (KR); Sang Yun Ma, Incheon (KR); Sang Hyeok Cho, Gyeonggi-Do (KR); Jae Yeong Bae, Seoul (KR); Ron Huemoeller, Gilbert, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 30 days.

(21) Appl. No.: 17/498,839

(22) Filed: Oct. 12, 2021

(65) Prior Publication Data
US 2022/0093576 A1 Mar. 24, 2022

Related U.S. Application Data

(63) Continuation of application No. 16/571,904, filed on Sep. 16, 2019, now Pat. No. 11,145,638.

(51) Int. Cl.
*H01L 23/31* (2006.01)
*H01L 25/16* (2023.01)
(Continued)

(52) U.S. Cl.
CPC .......... *H01L 25/165* (2013.01); *H01L 21/565* (2013.01); *H01L 23/13* (2013.01);
(Continued)

(58) Field of Classification Search
CPC ..... H01L 25/165; H01L 21/565; H01L 23/13; H01L 23/49816; H01L 23/5389;
(Continued)

(56) References Cited

U.S. PATENT DOCUMENTS 8,441,123 B1 * 5/2013 Lee ................... H01L 21/563
257/737
2004/0124540 A1 7/2004 Chen et al.
(Continued)

*Primary Examiner* — Samuel Park
(74) *Attorney, Agent, or Firm* — Spectrum IP Law Group LLC

(57) ABSTRACT

An exemplary semiconductor device can comprise (a) a substrate comprising a substrate dielectric structure between the substrate top side and the substrate bottom side, conductive pads at the substrate bottom side, and a substrate cavity through the substrate dielectric structure, (b) a base electronic component comprising inner short bumps; outer short bumps bounding a perimeter around the inner short bumps, and tall bumps between the outer short bumps and an edge of the base component top side, and (c) a mounted electronic component coupled to the inner short bumps of the base electronic component. The tall bumps of the base component can be coupled to the conductive pads of the substrate. The mounted electronic component can be located in the substrate cavity. The substrate bottom side can cover at least a portion of the outer short bumps of the base electronic component. Other examples and related methods are disclosed herein.

18 Claims, 12 Drawing Sheets

(51) Int. Cl.
*H01L 23/13* (2006.01)
*H01L 23/00* (2006.01)
*H01L 23/538* (2006.01)
*H01L 25/00* (2006.01)
*H01L 21/56* (2006.01)
*H01L 23/498* (2006.01)

(52) U.S. Cl.
CPC .... *H01L 23/49816* (2013.01); *H01L 23/5389* (2013.01); *H01L 24/16* (2013.01); *H01L 24/17* (2013.01); *H01L 24/32* (2013.01); *H01L 24/33* (2013.01); *H01L 24/73* (2013.01); *H01L 24/81* (2013.01); *H01L 24/83* (2013.01); *H01L 24/92* (2013.01); *H01L 25/50* (2013.01); *H01L 2224/16148* (2013.01); *H01L 2224/1703* (2013.01); *H01L 2224/26145* (2013.01); *H01L 2224/32145* (2013.01); *H01L 2224/32225* (2013.01); *H01L 2224/73204* (2013.01); *H01L 2224/73253* (2013.01); *H01L 2224/92225* (2013.01); *H01L 2924/19105* (2013.01)

(58) Field of Classification Search
CPC ......... H01L 24/16; H01L 24/17; H01L 24/32; H01L 24/33; H01L 24/73; H01L 24/81; H01L 24/83; H01L 24/92; H01L 25/50; H01L 2224/16148; H01L 2224/1703; H01L 2224/26145; H01L 2224/32145; H01L 2224/32225; H01L 2224/73204; H01L 2224/73253; H01L 2224/92225; H01L 2924/19105; H01L 25/16; H01L 2224/17515; H01L 24/14; H01L 24/13; H01L 2224/13082; H01L 2224/13101; H01L 2224/1403; H01L 2224/16145; H01L 2224/16225; H01L 2224/26175; H01L 2224/83007; H01L 2924/15192; H01L 2924/16152; H01L 21/52; H01L 21/563; H01L 21/568; H01L 23/053; H01L 23/5383; H01L 21/561
See application file for complete search history.

(56) References Cited

U.S. PATENT DOCUMENTS

| | | |
|---|---|---|
| 2005/0057883 A1 | 3/2005 | Bolken et al. |
| 2009/0181223 A1 | 7/2009 | Buchwalter et al. |
| 2009/0283888 A1 | 11/2009 | Choi et al. |
| 2011/0068444 A1 | 3/2011 | Chi et al. |
| 2011/0304999 A1 | 12/2011 | Yu et al. |
| 2015/0235936 A1* | 8/2015 | Yu .......................... H01L 23/36 257/737 |
| 2015/0235993 A1* | 8/2015 | Cheng ................ H01L 23/5389 438/107 |
| 2015/0255366 A1 | 9/2015 | Chung |
| 2016/0056087 A1 | 2/2016 | Wu et al. |
| 2017/0053850 A1 | 2/2017 | Watanabe |
| 2017/0186679 A1* | 6/2017 | Kelly ................ H01L 23/49805 |
| 2017/0194268 A1* | 7/2017 | Ho .......................... H01L 24/17 |
| 2018/0033770 A1* | 2/2018 | Hsu ........................ H01L 25/50 |
| 2018/0174984 A1 | 6/2018 | Hung |
| 2018/0240723 A1* | 8/2018 | Lu .................... H01L 23/49816 |
| 2019/0131273 A1 | 5/2019 | Chen et al. |
| 2020/0035604 A1 | 1/2020 | Rubin et al. |
| 2020/0058519 A1 | 2/2020 | Tsai et al. |

* cited by examiner

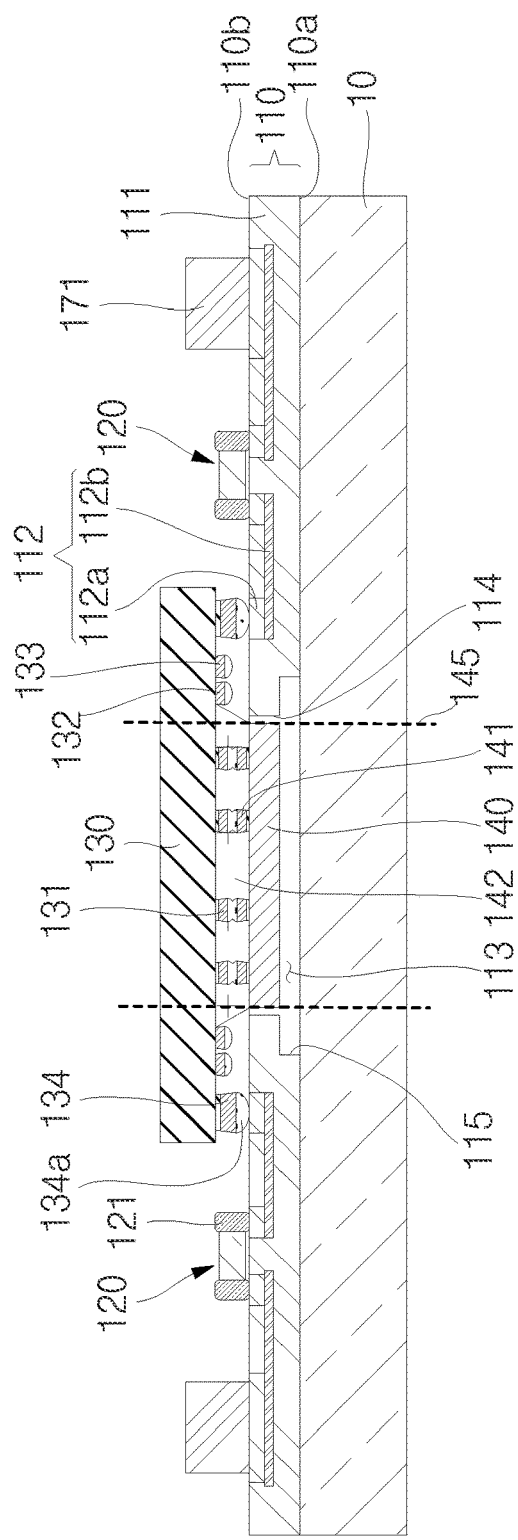
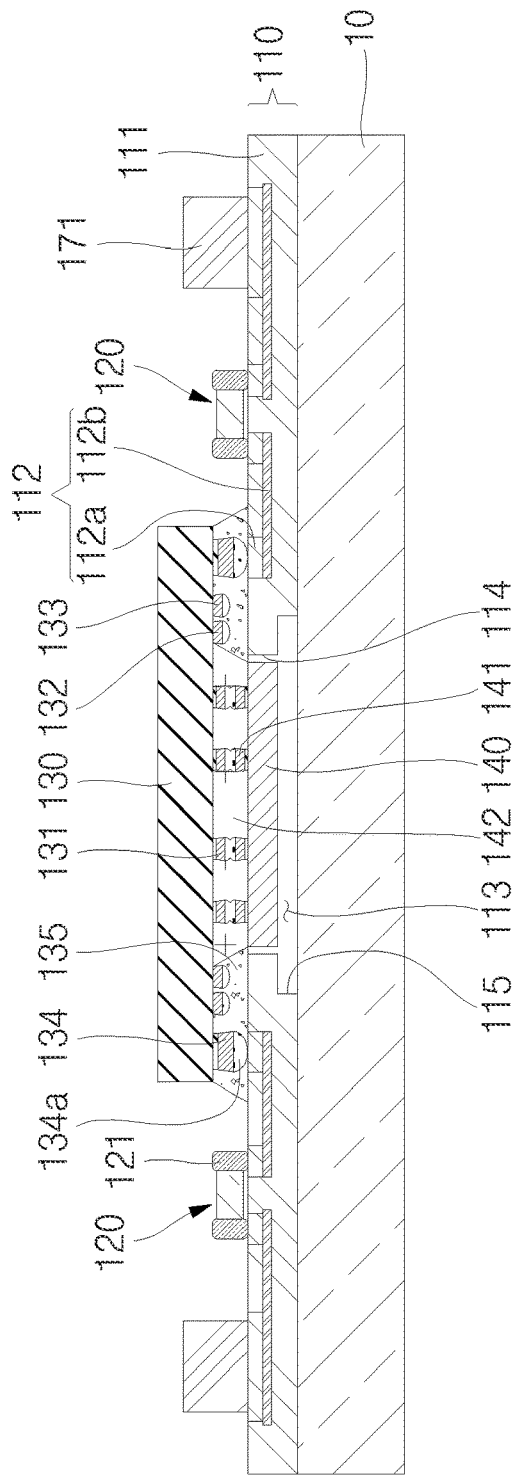
FIG. 2C
FIG. 2D

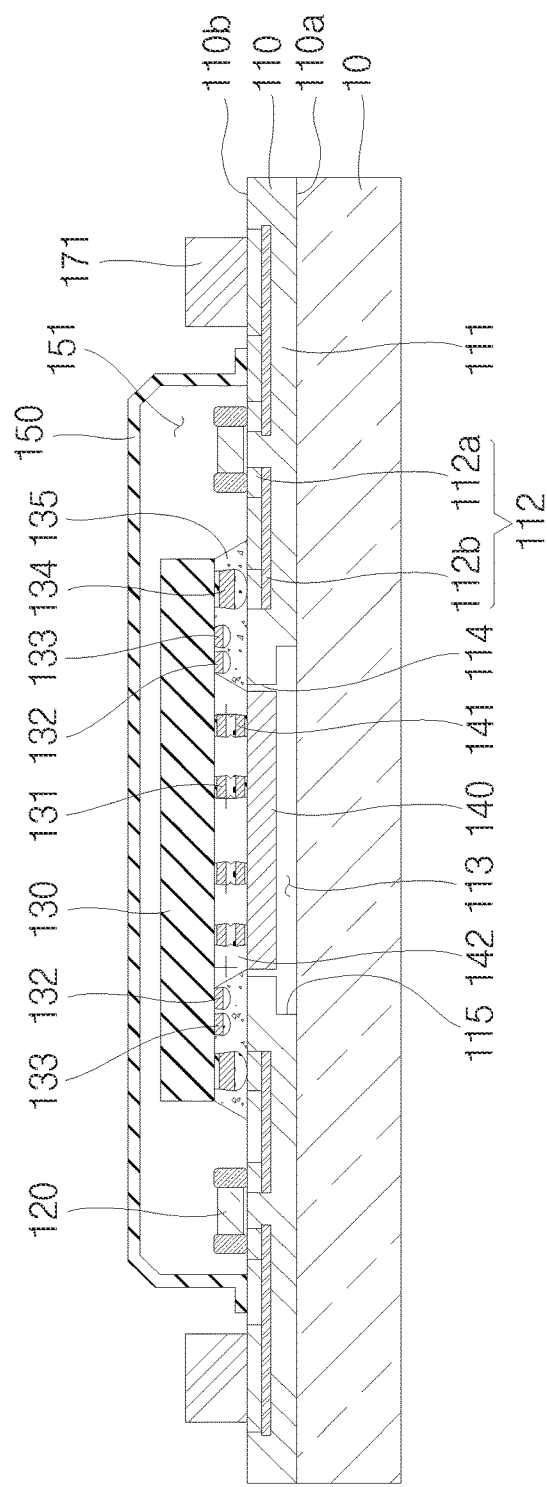
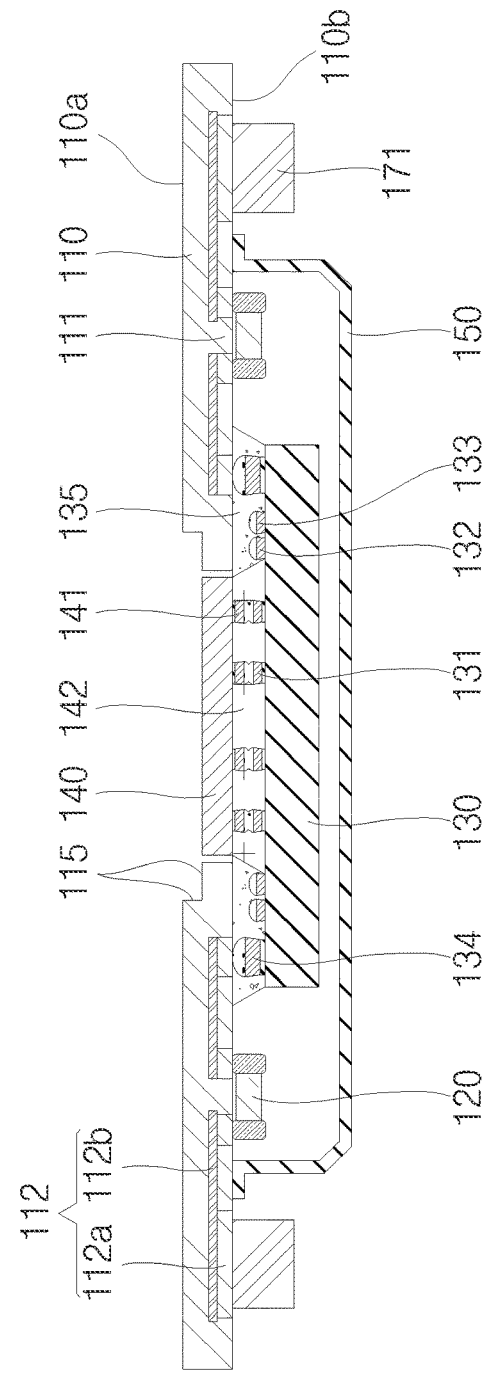

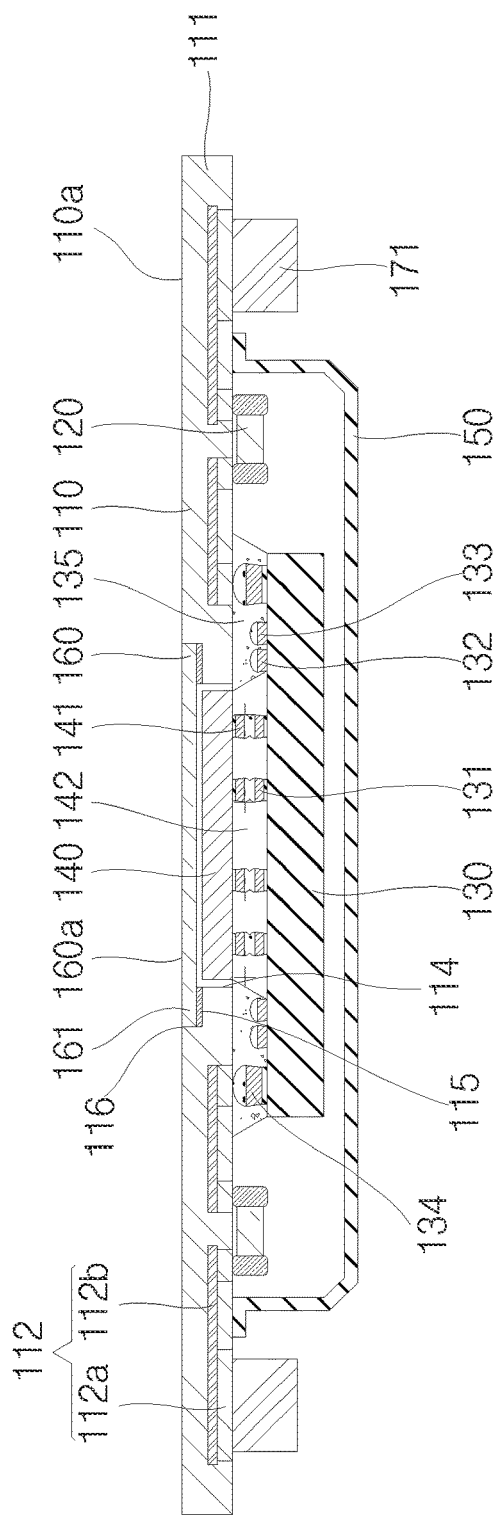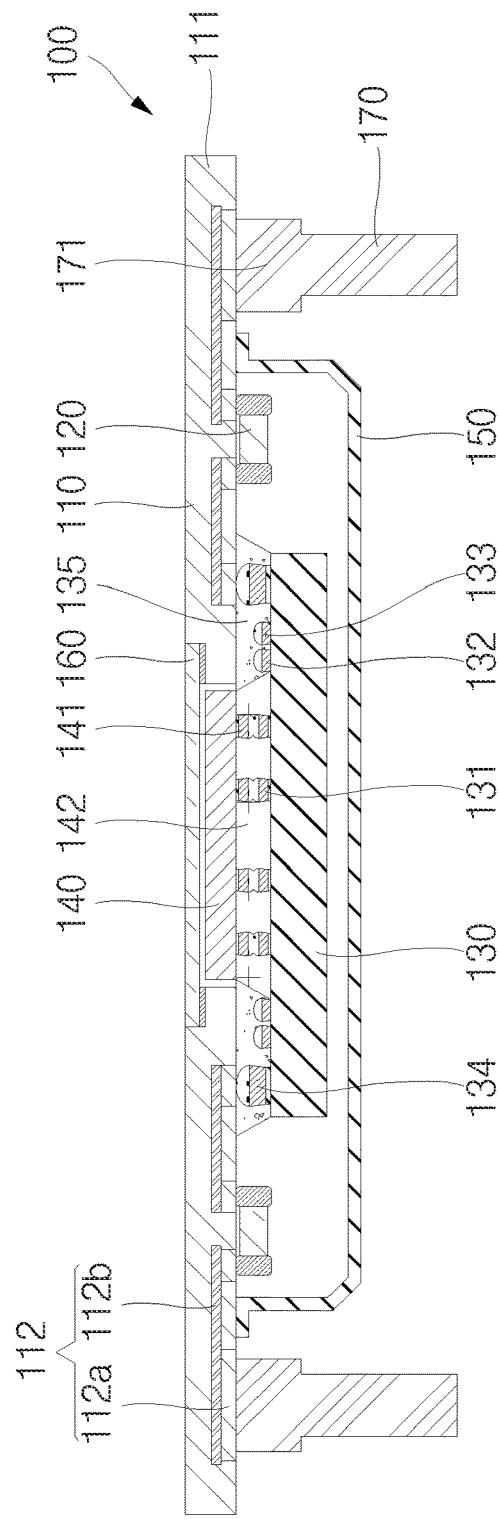

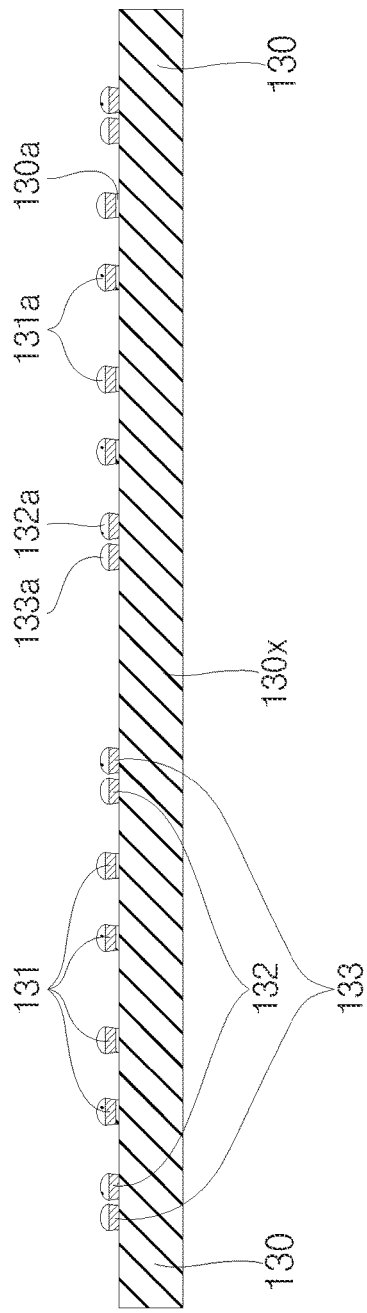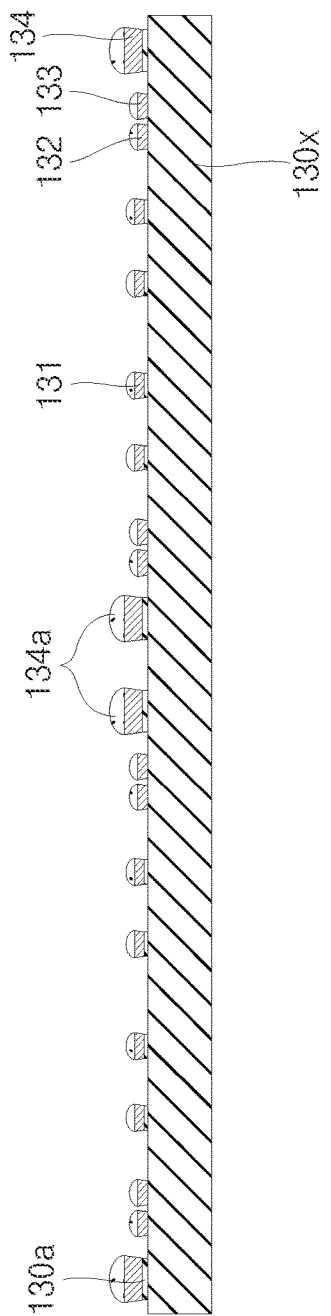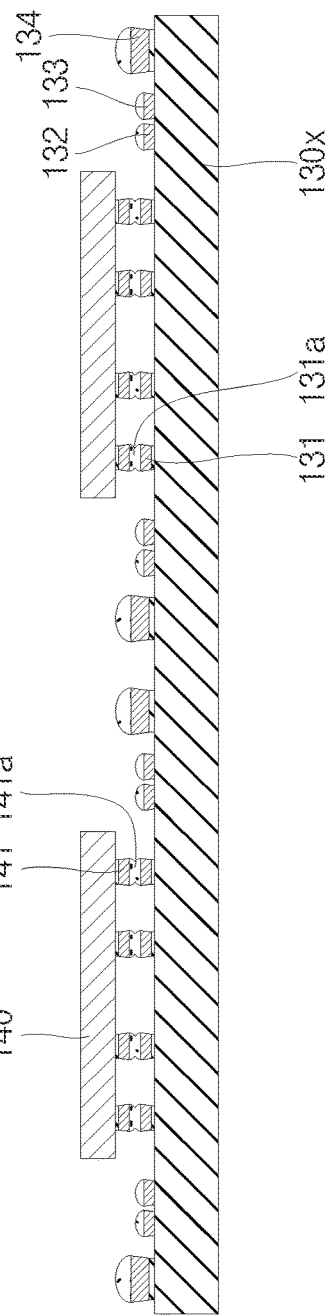

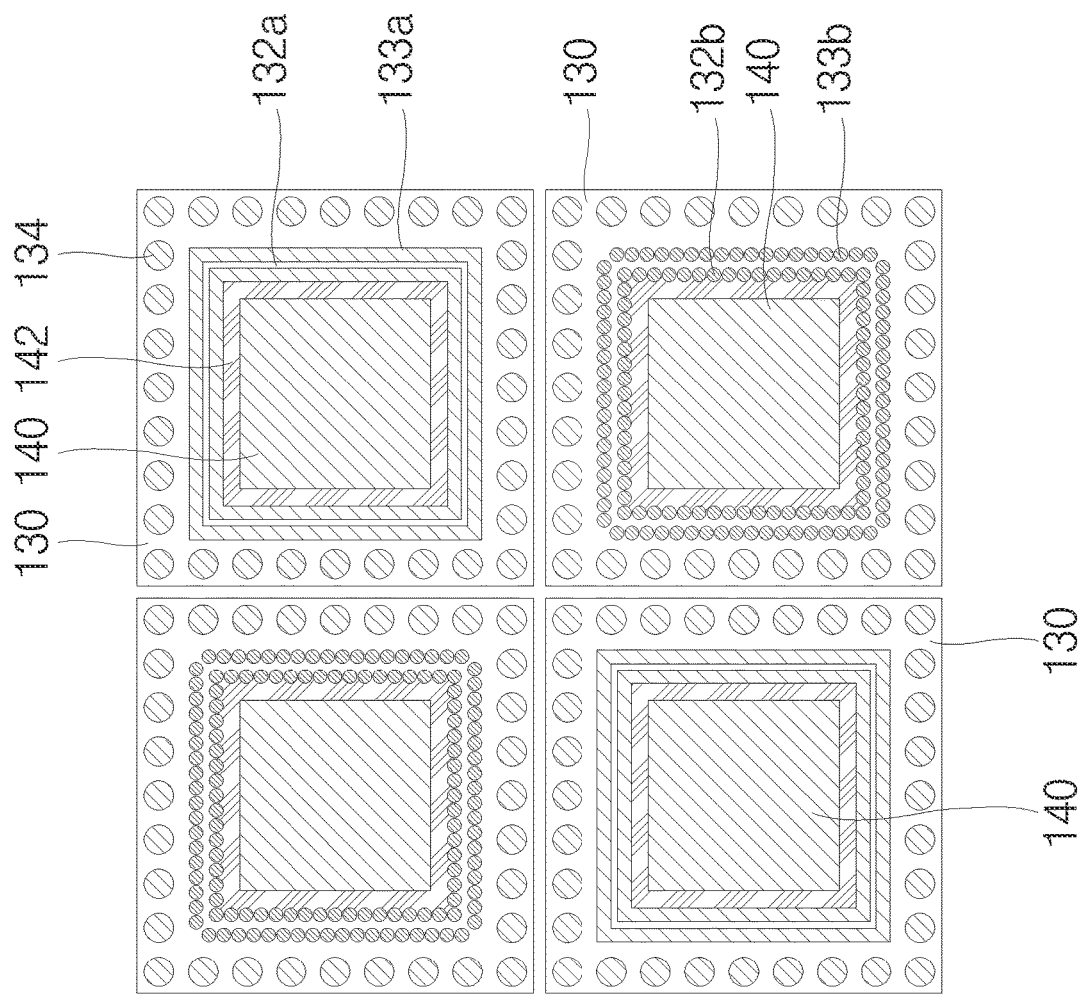

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2H show cross-sectional views of an example method for manufacturing an example semiconductor device.

FIGS. 4A to 4E show cross-sectional views of an example method for forming example stacked components shown in FIGS. 2C and 3B.

FIGS. 5A to 5E show plan views of an example method for forming example stacked components shown in FIGS. 4A to 4E.

Figure 1:
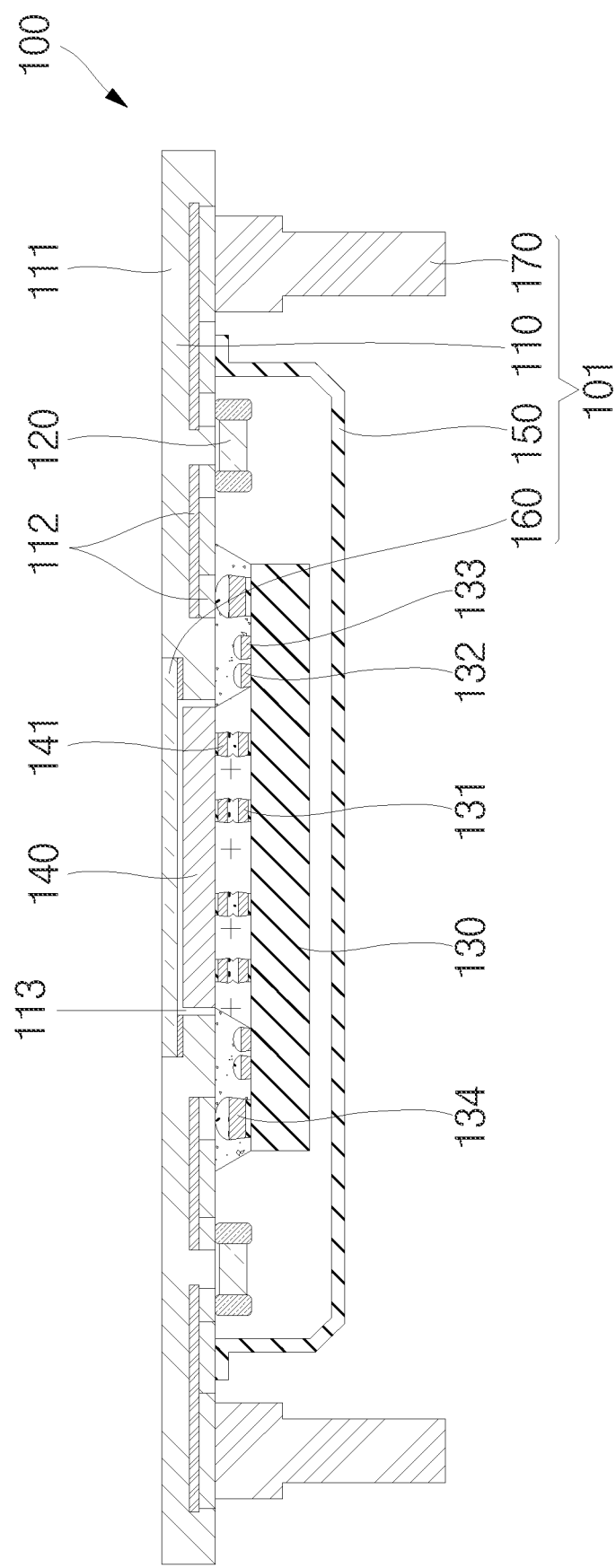
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device can comprise (a) a substrate comprising a substrate dielectric structure between the substrate top side and the substrate bottom side, conductive pads at the substrate bottom side, and a substrate cavity through the substrate dielectric structure, (b) a base electronic component comprising inner short bumps; outer short bumps bounding a perimeter around the inner short bumps, and tall bumps between the outer short bumps and an edge of the base component top side, and (c) a mounted electronic component coupled to the inner short bumps of the base electronic component. The tall bumps of the base component can be coupled to the conductive pads of the substrate. The mounted electronic component can be located in the substrate cavity. The substrate bottom side can cover at least a portion of the outer short bumps of the base electronic component.

In one example, a semiconductor device can comprise (a) a substrate comprising a substrate bottom side, conductive pads at the substrate bottom side, and a substrate cavity, (b) a base electronic component with a base component top side comprising inner short bumps, outer short bumps bounding a perimeter of the inner short bumps, and tall bumps between the outer short bumps and an edge of the base component top side, (c) a mounted electronic component coupled to the inner short bumps of the electronic component, and (d) a first underfill between the base electronic component and the mounted electronic component. The tall bumps of the base component can be coupled to the conductive pads of the substrate. Lateral sides of the mounted electronic component can be bounded by the substrate cavity. The first underfill can contact lateral portions of the inner short bumps and of the outer short bumps.

In one example, a method can comprise (a) providing a substrate comprising a substrate bottom side, conductive pads at the substrate bottom side, and a substrate cavity, (b) coupling a stacked component structure with the substrate, the stacked component structure comprising a base electronic component having a base component top side with inner short bumps, outer short bumps bounding a perimeter of the inner short bumps, and tall bumps between the outer short bumps and an edge of the base component top side, the stacked component structure further comprising a mounted electronic component coupled to the inner short bumps of the electronic component. The tall bumps of the base component can be coupled to the conductive pads of the substrate. The mounted electronic component can be in the substrate cavity. The substrate bottom side can cover at least a portion of the outer short bumps of the base electronic component.

Other examples are included in the present disclosure. Such examples may be found in the figures, in the claims, and/or in the description of the present disclosure.

FIG. 1 shows a cross-sectional view of an example semiconductor device 100. In the example shown in FIG. 1, semiconductor device 100 can comprise substrate 110, supplemental component 120, base electronic component 130, mounted electronic component 140, cap structure 150, cover structure 160, and external interconnect 170.

Substrate 110 can comprise dielectric structure 111, conductive structure 112, or substrate cavity 113. Base electronic component 130 can comprise interconnect short bumps 131, dam short bumps 132, 133, or interconnect tall bumps 134. Mounted electronic component 140 can comprise interconnects 141.

Substrate 110, cap structure 150, cover structure 160, or external interconnect 170 can comprise or be referred to as semiconductor package 101 or package 101, which can protect supplemental component 120, base electronic component 130, or mounted electronic component 140 from external elements or environmental exposure. In addition, semiconductor package 101 can provide electrical coupling between external elements and supplemental components 120, or between external elements and electronic components 130, 140.

FIGS. 2A to 2H show cross-sectional views of an example method for manufacturing example semiconductor device 100. FIGS. 3A to 3D show plan views of an example method for manufacturing example semiconductor device shown in FIGS. 2B to 2F.

Figure 2A:
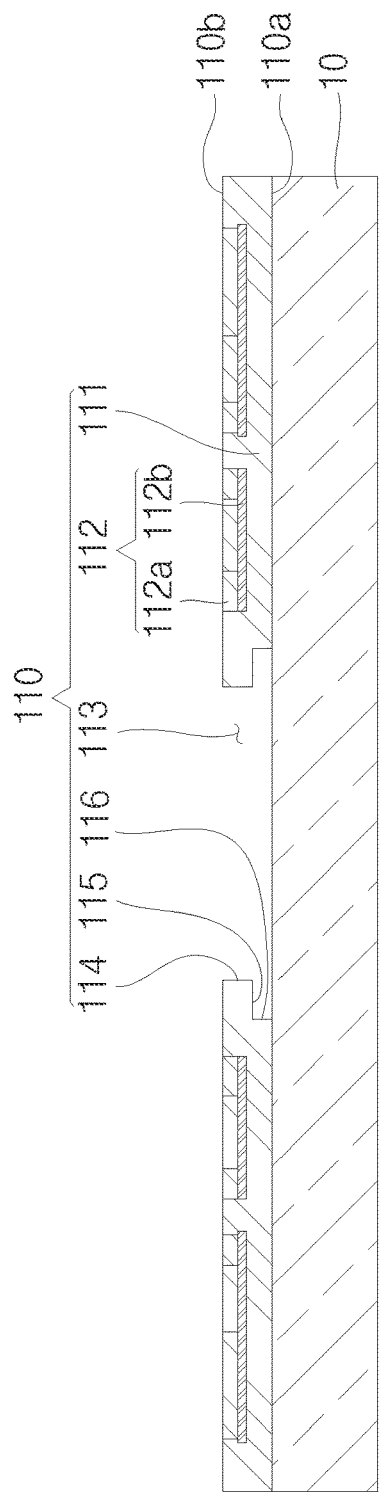

FIG. 2A shows a cross-sectional view of semiconductor device 100 at an early stage of manufacture. In the example shown in FIG. 2A, side 110a of substrate 110 can be attached to a side of carrier 10. While one substrate 110 can be attached to carrier 10 shown in FIG. 2A, multiple substrates 110 arranged adjacent each other in a row-wise or column-wise direction can be attached to carrier 10.

Substrate 110 can comprise dielectric structure 111, conductive structure 112 or substrate cavity 113. Substrate cavity 113 can pass through side 110b and side 110a of substrate 110. Substrate cavity 113 can be formed at the center of substrate 110. Substrate 110 can be a rectangular ring. Substrate 110 can further comprise cavity inner wall 114 extending from substrate side 110b to define a portion of substrate cavity 113. In some examples, substrate 113 can comprise cavity outer wall 116 extending from substrate side 110a. In some examples, substrate 110 can comprise ledge 115 extending between cavity inner wall 114 and cavity outer wall 116.

In some examples, substrate 110 can comprise or be referred to as a cavity substrate, a ceramic substrate, a laminate substrate, a printed circuit board, a through hole substrate, a rigid substrate, a buildup substrate, a pre-formed substrate, an RDL substrate, or a pre-molded lead frame.

In some examples, dielectric structure 111 can have substantially planar top or bottom sides. Top or bottom sides of dielectric structure 111 can be the same or coplanar with side 110b or side 110a of substrate 110, respectively. Dielectric structure 111 can have substrate cavity 113 passing through side 110b and side 110a of substrate 110, formed at its center. In some examples, dielectric structure 111 can comprise or be referred to as a dielectric layer or a core layer. Dielectric structure 111 can include one or more dielectric layers. In some examples, dielectric structure 111 can comprise one or more layers of ceramic material, epoxy resin, phenol resin, glass epoxy, polyimide, polyester, epoxy molding compound. In some examples, dielectric structure 111 can have a thickness in the range from approximately 0.1 mm (millimeter) to approximately 10 mm. Dielectric structure 111 can provide structural integrity to maintain substrate 110 at a substantially planar state.

Conductive structure 112 can comprise conductive pad 112a formed on side 110b of dielectric structure 111, or conductive path 112b formed within dielectric structure 111. Conductive structure 112 can comprise conductive pads 112a or conductive paths 112b. Conductive pad 112a can be formed on side 110b of dielectric structure 111 in a matrix having rows or columns. Conductive pads 112a can be exposed through side 110b of dielectric structure 111. In some examples, conductive pad 112a can comprise or be referred to as a conductor, a conductive substrate land, a conductive land, a substrate pad, a wiring pad, a connection pad, a micro pad, or an under-bump-metallurgy (UBM). Conductive path 112b can be positioned within dielectric structure 111 to electrically connect conductive pads 112a to one another. In some examples, conductive path 112b can comprise or be referred to as a conductor, a conductive material, a conductive via, a circuit pattern, a trace or a wiring pattern. In some examples, conductive pad 112a or conductive path 112b can comprise copper, iron, nickel, gold, silver, palladium or tin.

In some examples, substrate 110 can comprise a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride (Si3N4), silicon oxide (SiO2), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bis-maleimide triazine (BT) or FR4 and these types of RDL substrates can comprise or be referred to as a coreless substrate. Other substrates in this disclosure can also comprise an RDL substrate.

In some examples, substrate 110 can comprise a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In some examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process. Other substrates in this disclosure can also comprise a pre-formed substrate.

Carrier 10 can be a substantially planar plate. For example, carrier 10 can comprise or be referred to as a board, a wafer, a panel, or a strip. In some examples carrier 10 can comprise, for example, but not limited to, steel, stainless steel, aluminum, copper, ceramic, glass, a semiconductor or a wafer. Carrier 10 can have a thickness in the range from approximately 1 mm to approximately 1.5 mm or a width in the range from approximately 200 mm to approximately 510 mm. Carrier 10 can function to handle multiple components in one body during attachment of substrate 110, supplemental component 120, electronic components 130, 140 or cap structure 150. Carrier 10 can be commonly applied to different examples of this disclosure.

A temporary bond layer can be provided on a side of carrier 10. Such temporary bond layer can be formed on side of carrier 10 using a coating process, such as spin coating, doctor blade, casting, painting, spray coating, slot die coating, curtain coating, slide coating or knife over edge coating; a printing process, such as screen printing, pad printing, gravure printing, flexographic coating or offset printing; an inkjet printing process with features intermediate between coating and printing; or direct attachment of an adhesive film or an adhesive tape. The temporary bond layer can comprise or be referred to as a temporary adhesive film or a temporary adhesive tape. Temporary bond layer can be, for example, but not limited to, a thermally releasable tape or film, or a UV (ultraviolet) releasable tape or film that can be weakened or can be removed by heat or UV irradiation in its bonding strength. In some examples, temporary bond layer can have a weakened bonding strength or can be removed by physical or chemical external forces. The temporary bond layer can allow carrier 10 to be subsequently separated from substrate 110.

Figure 2B:
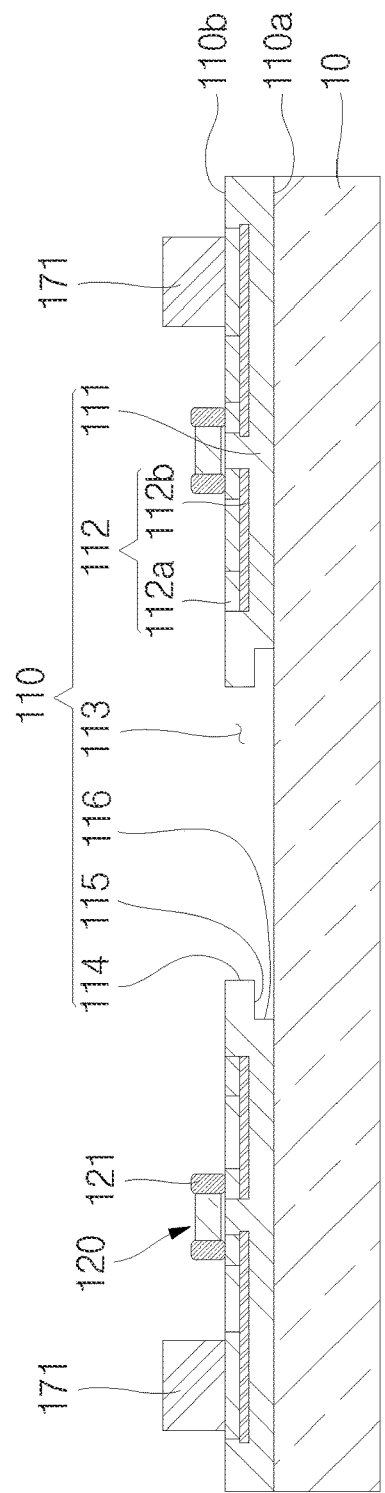
Figure 3B:
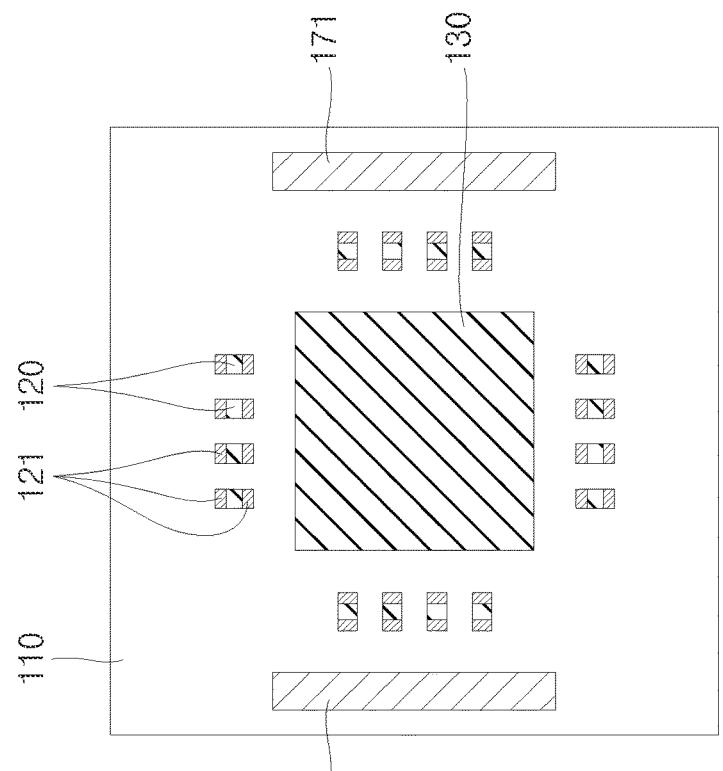
FIGS. 3A to 3D show plan views of an example method for manufacturing an example semiconductor device shown in FIGS. 2B to 2F.
Figure 3A:
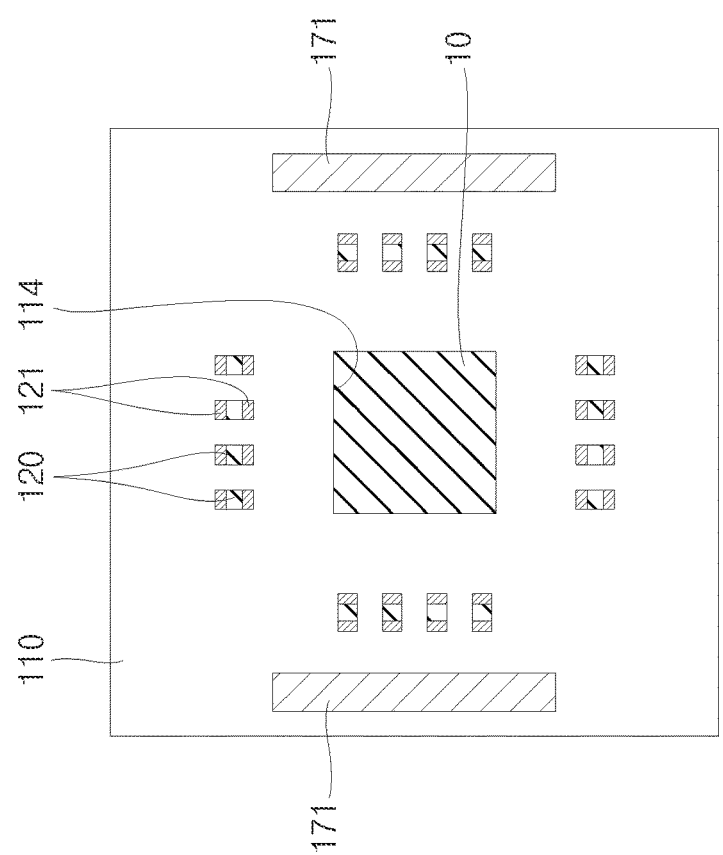

FIGS. 2B and 3A show semiconductor device 100 at a later stage of manufacture. In the example shown in FIGS. 2B and 3A, supplemental components 120 and external pads 171 can be coupled to conductive structure 112 of substrate 110.

In some examples, pick-and-place equipment can pick up supplemental components 120 or external pads 171 to place the same on conductive pads 112*a* of substrate 110. In some examples, Supplemental components 120 or external pads 171 can be connected to conductive structure 112 of substrate 110 by mass reflow, thermal compression or laser assist bonding.

In some examples, supplemental component 120 can comprise a passive component such as a resistor, a capacitor, an inductor, or a diode. There can be examples where one or more of supplemental components 120 can comprise an active electronic component, such as of the type described with respect to electronic component 130 or 140. In addition, supplemental component 120 can further comprise terminal 121 and can be connected to conductive pad 112*a* of substrate 110 through terminal 121. In some examples, supplemental component 120 can have a total thickness in the range from approximately 0.1 mm to approximately 3 mm. In addition, supplemental component 120 can comprise a plurality of supplemental components.

In some examples, external pad 171 can be attached at opposite perimeter portions of side 110*b* of substrate 110. In some examples, External pad 171 can comprise copper, gold, silver, palladium, tin or nickel. In some examples, external pad 171 can comprise or be referred to as a conductor, a conductive material, a conductive layer, a conductive pad, a conductive post, or a conductive pillar. In some examples, external pad 171 can have a total thickness in the range from approximately 1 mm to approximately 10 mm or a width in the range from approximately 1 mm to approximately 10.0 mm.

FIGS. 2C and 3B show semiconductor device 100 at a later stage of manufacture. In the example shown in FIGS. 2C and 3B, stacked components 130, 140 can be electrically connected to conductive structure 112 at side 110*b* of substrate 110. Stacked components 130, 140 can comprise base electronic component 130 and mounted electronic component 140 coupled together. Base electronic component 130 can be coupled to side 110*b* of substrate 110, such that mounted electronic component 130 can be located in substrate cavity 113. When stacked components 130,140 are coupled to substrate 110, side 110*b* of substrate 110 covers at least a portion of dam short bumps 132,133.

Figure 4D:
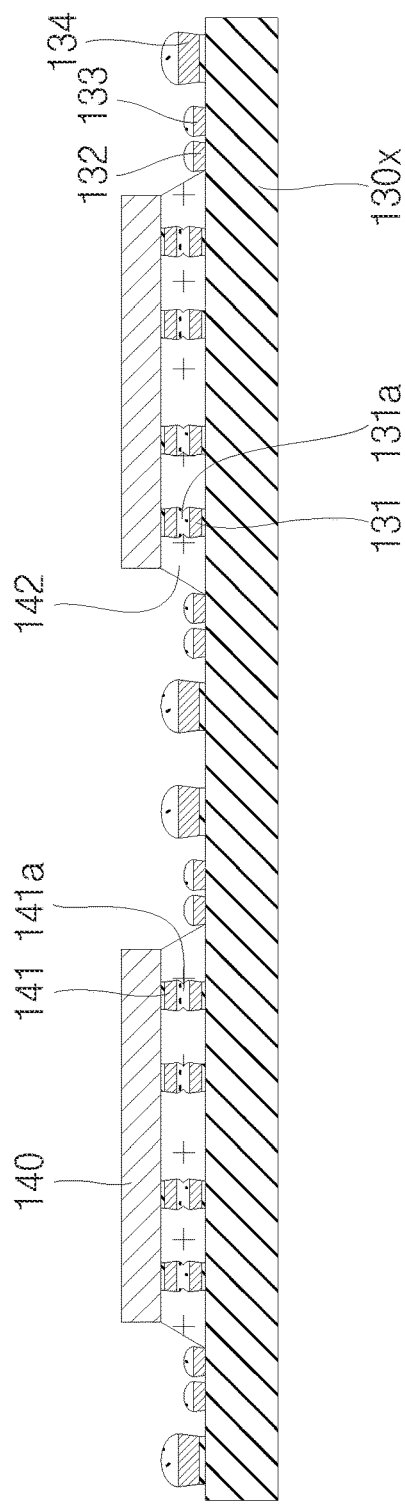
Figure 4E:
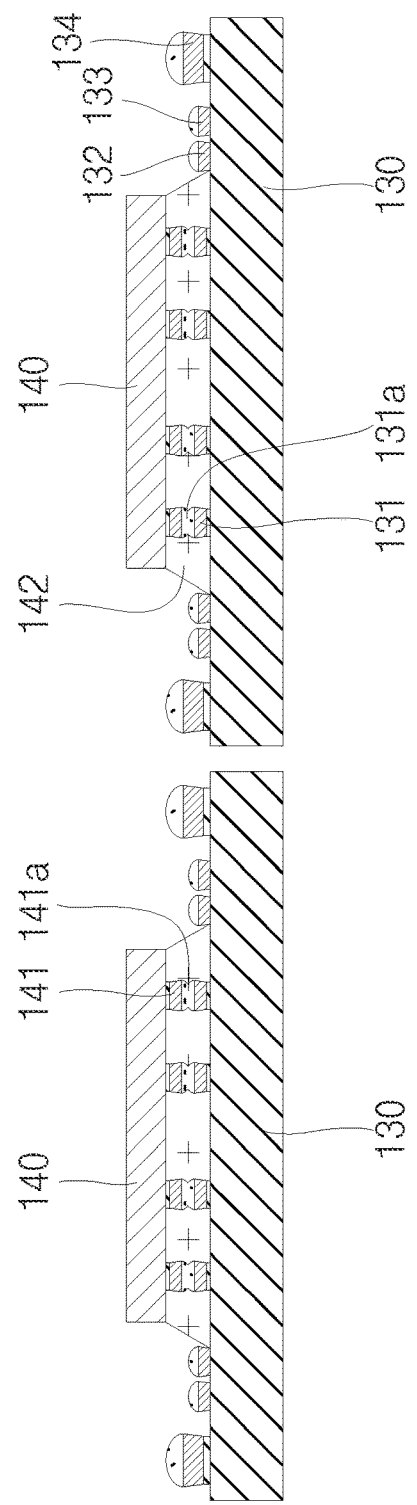
Figure 5B:
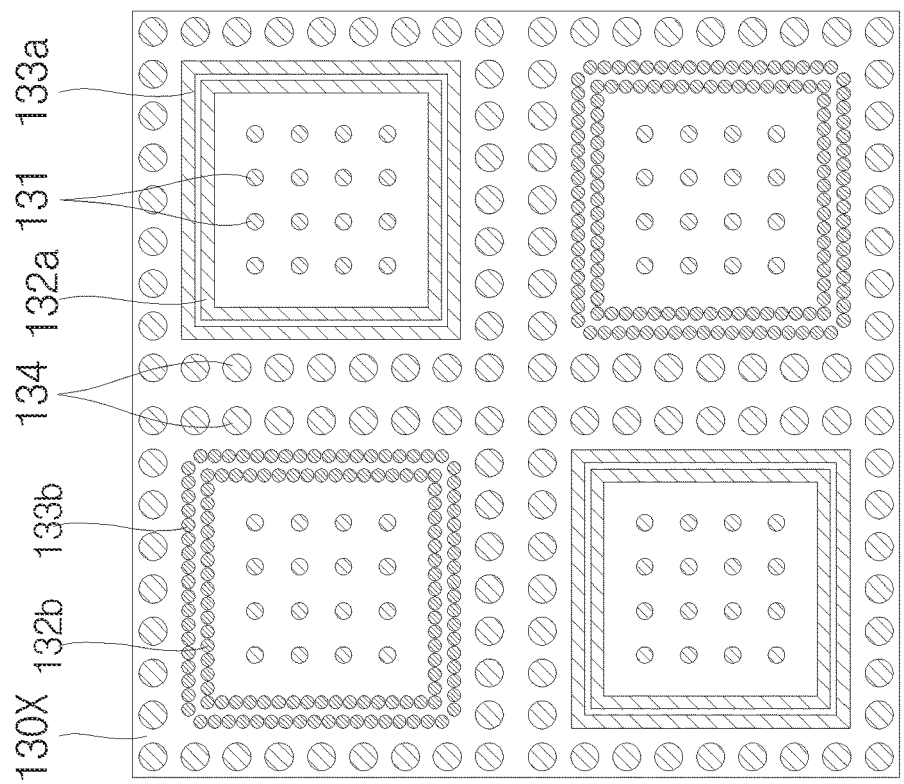
Figure 5A:
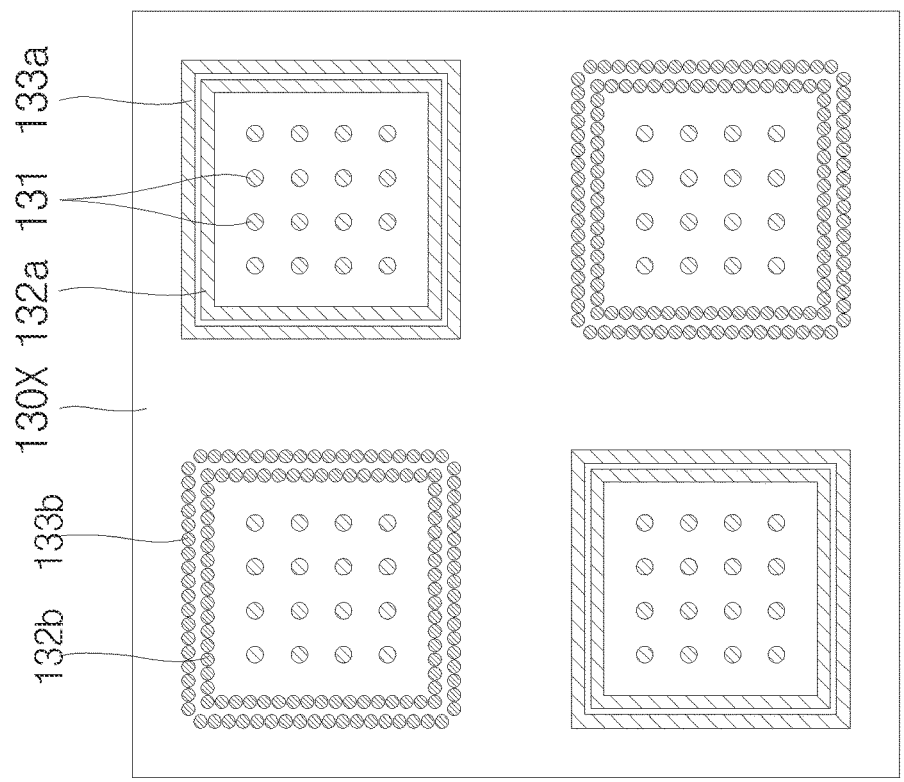

Referring to FIGS. 4A to 4E and FIGS. 5A to 5E cross-sectional views and plan views are shown of an example method for forming stacked components 130, 140 shown in FIGS. 2C and 3B. FIGS. 4A and 5A show stacked components 130, 140 at an early stage of manufacture in example method for forming stacked components 130, 140.

In the example shown in FIGS. 4A and 5A, interconnect short bumps 131 and dam short bumps 132, 133 can be formed on top side of wafer 130x comprising base electronic component 130. Interconnect short bumps 131 can be electrically connected to terminal 130a on top side of wafer 130x. Terminal 130a can be input/output terminal of base electronic component 130 and can comprise or be referred to as a die pad, a bond pad, or a redistributed pad. In some examples, the redistributed pad can comprise a metallized pad that has been redistributed or relocated away from a location of a corresponding die pad to which it is coupled by one or more redistribution layers or traces. Interconnect short bumps 131 can be formed in a matrix having rows or columns, like terminal 130a. Interconnect short bumps 131 can be formed upwardly to have a predetermined height from terminal 130a. Interconnect short bumps 131 can comprise or be referred to inner short bumps, as plated bumps, pillar bumps, solder bumps, conductive pillars, or conductive posts. In some examples interconnect short bumps 131 can comprise a conductive material comprising copper, gold, silver, palladium, or nickel. In some examples, tip 131a can be further formed at an end of interconnect short bumps 131 opposite base electronic component 130. As an example, tip 131a can comprise a conductive material comprising Sn, Ag, Pb, Cu, Sn—Pb, Sn37-Pb, Sn95-Pb, Sn—Pb—Ag, Sn—Cu, Sn—Ag, Sn—Au, Sn—Bi, or Sn—Ag—Cu. Base electronic component 130 and mounted electronic component 140 can be electrically connected to each other by tip 131a. In some examples, interconnect short bumps 131 can have a height in the range from approximately 10 μm to approximately 35 μm or a width in the range from approximately 20 μm to approximately 50 μm.

Dam short bumps 132, 133 can bound or be spaced apart from a perimeter around short bumps 131. In some examples, dam short bumps 132,133 can comprise or be referred to outer short bumps, as plated bumps, pillar bumps, solder bumps, conductive pillars, or conductive posts. In some examples, dam short bumps 132, 133 can form rectangular perimeters. In some examples, dam short bumps 132, 133 can define one or more continuous wall structures forming respective dam perimeter walls, as seen for exemplary dam short bumps 132a, 133a in FIG. 5. In some embodiments, dam short bumps 132 or 133 can comprise multiple individual bumps, similar to interconnect short bumps 131, linearly arranged adjacent each other to define respective dam perimeter walls, as seen for exemplary dam short bumps 132b, 133b in FIG. 5. Inward dam short bumps 132 and outward dam short bumps 133 can be adjacent each other.

Dam short bumps can bound a perimeter around interconnect short bumps 131. In some examples, dam short bumps 132, 133 can be made of the same material as interconnect short bumps 131, or can be formed by the same manufacturing process. Tips 132a or 133a can be further formed at ends of dam short bumps 132 or 133 opposite base electronic component 130. Tips 132a,133a can be made of the same material as tip 131a of interconnect short bumps 131. The material of tips 131a, 132a, 133a can be different than the material of interconnect short bumps 131 and different than the material of dam short bumps 132, 133. Dam short bumps 132, 133 can have heights in the range from approximately 10 μm to approximately 35 μm or widths in the range from approximately 20 μm to approximately 50 μm. In some examples, the height of dam short bumps 132, 133 can be substantially the same as the height of interconnect short bumps 131. A sum of widths of inward dam short bumps 132, plus outward dam short bumps 133, plus a distance between inward dam short bumps 132 and outward dam short bumps 133, can be in the range from approximately 80 μm to approximately 200 μm. In some examples, dam short bumps 132, 133 can be formed as integrated components, not as separate components. In some examples, interconnect short bumps 131 or dam short bumps 132, 133 can be formed by, for example, but not limited to, electroplating, electroless plating, sputtering, PVD, CVD, MOCVD, ALD, LPCVD, or PECVD.

FIGS. 4B and 5B show stacked components 130, 140 at a later stage of manufacture in example method for forming stacked components 130, 140.

In the example shown in FIGS. 4B and 5B, interconnect tall bumps 134 can be formed on top side of wafer 130x. Interconnect tall bumps 134 can be electrically connected to terminal 130a on top side of wafer 130x. Interconnect tall bumps 134 can be input/output terminal of base electronic component 130 or can comprise or be referred to as a die pad, a bond pad, or a redistribution pad. Interconnect tall bumps 134 can be outwardly spaced a predetermined distance apart from outward dam short bumps 133. In some examples, interconnect tall bumps 134 can be spaced approximately 10 μm to approximately 150 μm apart from outward dam short bumps 133. Interconnect tall bumps 134 can be formed to have one or more rows or columns parallel to outward dam short bumps 133. Interconnect tall bumps 134 can have a structure similar to interconnect short bumps 131 or can be formed by a similar process to interconnect short bumps 131. However, interconnect tall bumps 134 can have a larger size, height, or width, than interconnect short bumps 131 or dam short bumps 132, 133.

Interconnect tall bumps 134 can further comprise tip 134a. Interconnect tall bumps 134 can electrically connect base electronic component 130 and substrate 110 to each other through tip 134a. In some examples, interconnect tall bumps 134 can have a height in the range from approximately 45 μm to approximately 65 μm or a width in the range from approximately 75 μm to approximately 125 μm. In some examples, a height difference between interconnect tall bumps 134 and interconnect short bumps 131 and a height difference between interconnect tall bumps 134 and dam short bumps 132, 133 can be in the range from approximately 10 μm to approximately 55 μm.

Figure 5D:
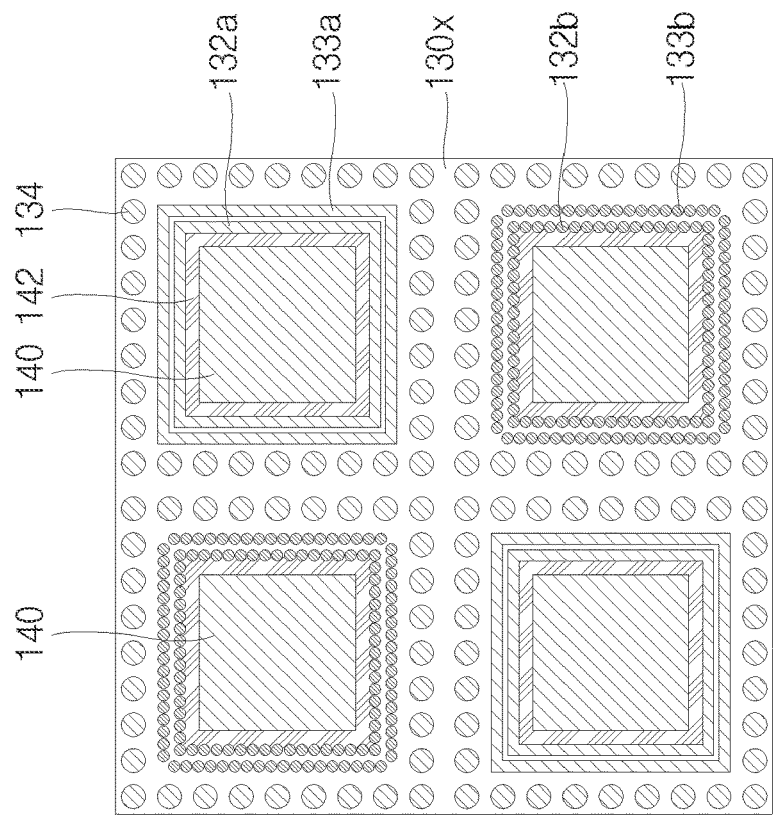
Figure 5C:
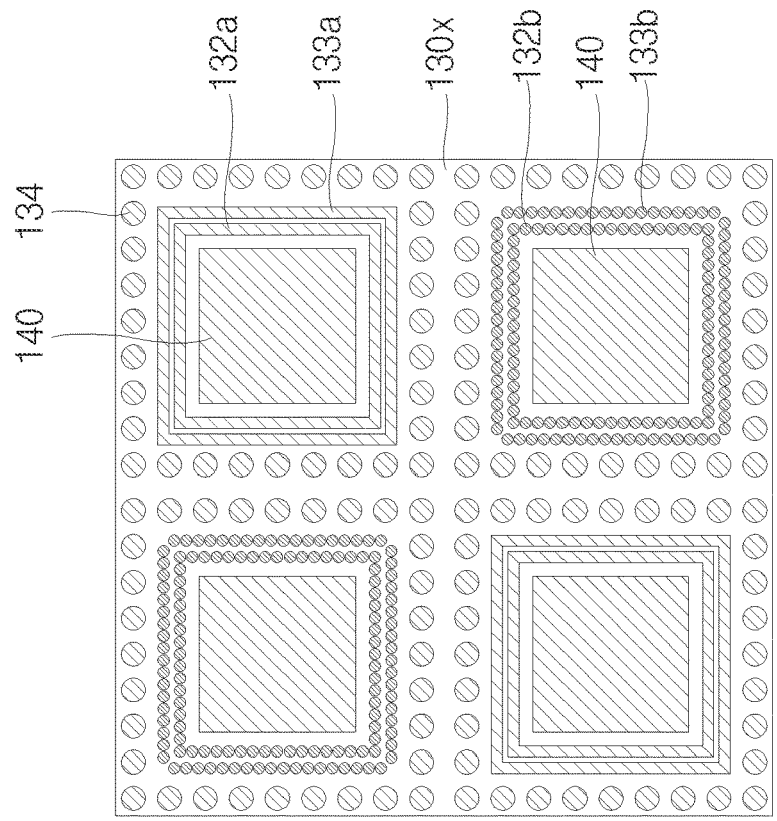

FIGS. 4C and 5C show stacked components 130, 140 at a later stage of manufacture in example method for forming stacked components 130, 140.

In the example shown in FIGS. 4C and 5C, mounted electronic component 140 can be electrically connected to interconnect short bumps 131 of wafer 130x. In some examples, pick-and-place equipment can pick up mounted electronic component 140 to place the same on tip 131a of interconnect short bumps 131 of wafer 130x. Next, tip 131a can be melted by mass reflow, thermal compression or laser assist bonding to allow mounted electronic component 140 to be electrically connected to interconnect short bumps 131 of wafer 130x.

In some examples, mounted electronic component 140 can comprise or be referred to as a semiconductor die or a semiconductor chip. In some examples, mounted electronic component 140 can comprise a sensor, a micro-electro mechanical system (MEMS), or a light emitting diode (LED). In some examples, mounted electronic component 140 can comprise an active region and a non-active region. In some examples, active region can face wafer 130x. In some examples, active region of mounted electronic component 140 can comprise interconnects 141. In some examples, interconnects 141 can comprise or be referred to as die pads, bond pads, redistributed pads, aluminum pads, conductive pillars, conductive posts, or bumps.

Interconnects 141 can comprise tip 141a formed at its end. Tip 141a can be the same material as tip 131a of interconnect short bumps 131. Interconnects 141 of mounted electronic component 140 can be positioned on interconnect short bumps 131 of wafer 130x, and tips 131a or 141a can be melted to allow interconnects 141 of mounted electronic component 140 and interconnect short bumps 131 of wafer 130x to be electrically connected to each other. In some examples, mounted electronic component 140 can have a total thickness in the range from approximately 100 μm to approximately 780 μm.

FIGS. 4D and 5D show stacked components 130, 140 at a later stage of manufacture in example method for forming stacked components 130, 140.

In the example shown in FIGS. 4D and 5D, underfill 142 can fill a portion between mounted electronic component 140 and base electronic component 130 in wafer 130x. Inward dam short bumps 132 or outward dam short bumps 133 can define a dam perimeter to contain a flow of underfill 142 from flowing to interconnect tall bumps 134. In some examples, underfill 142 can comprise or be referred to as a dielectric layer or a non-conductive paste. In some examples, underfill 142 can be a resin free of inorganic fillers. In some examples, underfill 142 can be injected into a gap between mounted electronic component 140 and wafer 130x using capillary action. In some examples, underfill 142 can be first dispensed so as to cover interconnect short bumps 131 positioned on wafer 130x, and interconnects 141 and tip 141a of mounted electronic component 140 can then be electrically connected to interconnect short bumps 131 while passing through underfill 142. Underfill 142 can prevent stacked components 130, 140 being electrically disconnected from each other due to physical or chemical shocks.

FIGS. 4E and 5E show stacked components 130, 140 at a later stage of manufacture in example method for forming stacked components 130, 140.

In the example shown in FIGS. 4E and 5E, wafer 130x can be divided into individual stacked components 130, 140 by a singulation process. A region of wafer 130x can be removed using, for example, a saw, a diamond wheel, a laser beam, or an etching process, to define individual stacked components 130, 140.

In some examples, base electronic components 130 can be singulated first from wafer 130x, and mounted electronic components can be attached afterwards to such singulated base electronic components 130.

Individual stacked components 130, 140 can comprise base electronic component 130 and mounted electronic component 140. Base electronic component 130 can comprise interconnect short bumps 131 electrically connected to mounted electronic component 140, inward dam short bumps 132 and outward dam short bumps 133 containing an overflow underfill 142, and interconnect tall bumps 134 located between dam short bumps 133 and an edge of the top side of base electronic component 130. Base electronic component 130 can comprise or be referred to as a semiconductor die or a semiconductor chip. In some examples, base electronic component 130 can comprise at least one of a logic die, a logic device, a micro control unit, a memory, a processor, a digital signal processor, a network processor, a power management unit, an audio processor, an RF circuit, a wireless baseband system on chip processor, or an application specific integrated circuit.

Returning to FIG. 2C, stacked components 130, 140 completed in the above-described manner can be electrically connected to conductive pad 112a exposed to side 110b of substrate 110. In some examples, pick-and-place equipment can transfer stacked components 130, 140 to substrate 110. Interconnect tall bumps 134 can be positioned on conductive pad 112a of substrate 110. Next, tip 134a can be melted by mass reflow, thermal compression or laser assist bonding to allow base electronic component 130 of stacked components 130, 140 to be electrically connected to substrate 110. Mounted electronic component 140 can be electrically connected to substrate 110 through base electronic component 130.

Stacked components 130, 140 can be electrically connected to substrate 110 through interconnect tall bumps 134 having a greater height than interconnect short bumps 131 or dam short bumps 132, 133. Because of their shorter height compared to interconnect tall bumps 134, dam short bumps 132, 133 of base electronic component 130 can remain spaced apart from substrate 110. This allows substrate 110 to extend over dam short bumps 132, 133, decreasing the size needed for substrate cavity 113 and also decreasing overall the area needed for substrate 110. Mounted electronic component 140 of stacked components 130, 140 can be positioned within substrate cavity 113 of substrate 110, adjacent to but without contacting touching cavity inner wall 114. In some examples, substrate 110 can extend such that footprint 145 of mounted electronic component 140 can be closer to cavity inner wall 114 than to a closest one of dam short bumps 132, 133.

In some examples, the distance between mounted electronic component 140 and cavity inner wall 114 can thus be reduced to approximately 0.01 mm to approximately 1 mm.

Figure 3D:
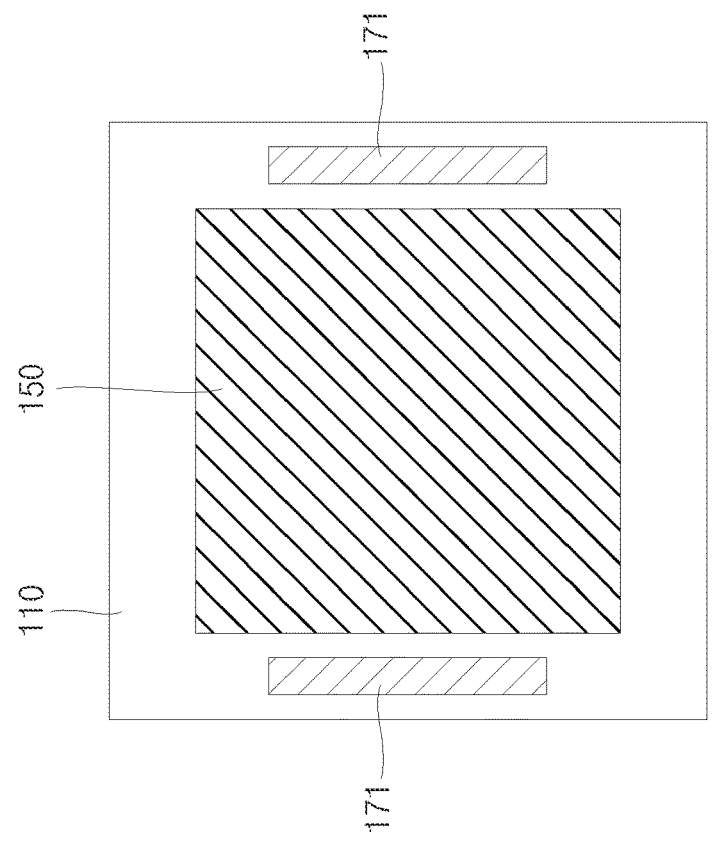
Figure 3C:
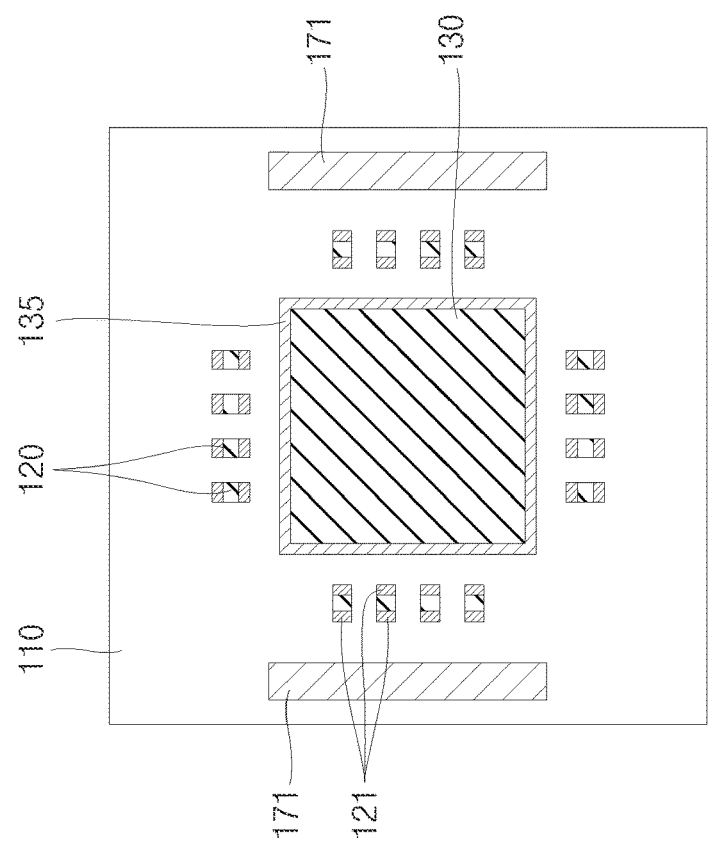

FIGS. 2D and 3C show semiconductor device 100 at a later stage of manufacture. In the example shown in FIGS. 2D and 3C, underfill 135 can fill a portion between substrate 110 and base electronic component 130. Underfill 135 can be made of a similar material to underfill 142 or can be formed by a similar process to underfill 142. In some examples, underfill 135 can contact at a lateral portion underfill 142, a lateral portion of interconnect tall bumps 134, or a lateral portion of dam short bumps 131,133. In some examples, underfill 135 can extend between substrate 110 and dam short bumps 131, 133. Since mounted electronic component 140 and cavity inner wall 114 are spaced apart from each other by small distance, it is possible to prevent underfill 135 from penetrating into substrate cavity 113 due to surface tension of underfill 135.

FIGS. 2E and 3D show semiconductor device 100 at a later stage of manufacture. In the example shown in FIGS. 2E and 3D, cap structure 150 can be attached to side 110b of substrate 110. Cap structure 150 can be configured to enclose supplemental component 120, base electronic component 130, or mounted electronic component 140 in hermetic enclosure 151. In some examples, cap structure 150 can be attached to substrate 110 with an adhesive. In some examples, cap structure 150 can be coupled attached with a conductive material, such as solder, to conductive structure 112 of substrate 110. In some examples, cap structure 150 can be pre-fabricated using a metal, plastic or ceramic to then be coupled or bonded to substrate 110. In some examples, cap structure 150 can protect conductive pad 112a, supplemental component 120, base electronic component 130 and mounted electronic component 140 from external elements or environmental exposure. In some examples, cap structure 150 can comprise or be referred to as a lid, a cap cover, or an encapsulant mold compound. In addition, cap structure 150 can comprise or be referred to as a molding part, a sealing part, an encapsulation part, a protection part, a package or a body. In some examples, cap structure 150 can have a height in the range from approximately 0.4 mm to approximately 4 mm.

FIG. 2F shows semiconductor device 100 at a later stage of manufacture. In the example shown in FIG. 2F, semiconductor device 100 can be flipped. Carrier 10, positioned on flipped substrate 110, can be removed, along with its temporary bond layer, thereby exposing side 110a of substrate 110. Carrier 10 can be removed by releasing the temporary bond layer from substrate 110 using UV or laser. Removing of carrier 10 can also be performed by a grinding or chemical etching process.

FIG. 2G shows semiconductor device 100 at a later stage of manufacture. In the example shown in FIG. 2G, cover structure 160 can be mounted on substrate 110 to cover a mounted electronic component 140. Cover structure 160 can be a flat plate. In some examples, a perimeter of cover structure 160 can be attached to substrate 110 or ledge 115 by cover seal 161, which can comprise an adhesive. In some examples, pick-and-place equipment can pick up cover structure 160 to place the same on ledge 115, thereby allowing cover structure 160 to be bonded to ledge 115. In some examples, side 160a of cover structure 160 need not protrude past side 110a of substrate 110, or both can be substantially coplanar. Mounted electronic component 140 can be positioned under cover structure 160. Cover structure 160 can be spaced apart from mounted electronic component 140. Cover seal 161 can have an adhesive component or can comprise at least one of metal, Kovar (i.e., an iron-nickel-cobalt alloy), or a mold compound. In some examples, cover structure 160 can comprise or be referred to as a cover window, a cover, a membrane, or a filter. In some examples, cover structure 160 can comprise a translucent material, a permeable material, or a glass material. Cover structure 160 can have a height in the range from approximately 1 mm to approximately 20 mm.

FIG. 2H shows semiconductor device 100 at a later stage of manufacture. In the example shown in FIG. 2H, external interconnect 170 can be formed at external pad 171. External interconnect 170 can be electrically connected to substrate 110 through external pad 171. External interconnect 170 can be electrically connected to supplemental component 120 or base electronic component 130 through substrate 110, or can be electrically connected to mounted electronic component 140 through substrate 110 or base electronic component 130.

In some examples, external interconnect 170 can comprise a pin, a wire, a connector with a flexible conductor or flexible substrate, a metal-core solder ball, or a solder ball. External interconnect 170 can have a height in the range from approximately 1 mm to approximately 10 mm. In some examples, external interconnect 170 can comprise or be referred to as an external input/output terminal of semiconductor device 100. Before or after forming external interconnect 170, substrate 110 can be divided into individual semiconductor devices 100 by a singulation process.

As seen from the views of finalized semiconductor device 100, interconnect short bumps 131 that are adjacent to each other can comprise a first pitch between themselves, tailored for coupling with interconnects 141 of mounted electronic component 140. Dam short bumps 132,133 can comprise a second pitch between or amongst themselves, tailored for restricting underfill 142 from passing through. In some examples, the distance or pitch between an interconnect short bump 131 adjacent a dam short bump 132 can be greater than the distance or pitch between adjacent interconnect short bumps 131. In some examples, the distance between adjacent interconnect short bumps 131 can be greater than the distance between adjacent dam short bumps 132, greater than the distance between adjacent dam short bumps 133, or greater than the distance between a dam short bump 132 adjacent a dam short bump 133.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include different examples falling within the scope of the appended claims.

The invention claimed is:

1. A semiconductor device comprising:
   a base electronic component comprising:
      a base electronic component top side;
   a substrate comprising:
      a substrate top side;
      a substrate bottom side;
      a substrate dielectric structure between the substrate top side and the substrate bottom side;
      a substrate conductive structure comprising:
         conductive pads at the substrate bottom side; and
         conductive paths along the substrate dielectric structure and coupled to the conductive pads;
      and
      a substrate cavity through the substrate dielectric structure;
   short interconnects between the base electronic component top side and the substrate bottom side;
   a dam bounding a perimeter around the short interconnects; and
   tall interconnects adjacent to the dam between the base electronic component top side and the substrate bottom side, and coupled to the conductive pads of the substrate;
   a mounted electronic component in the substrate cavity and coupled to the short interconnects; and
   a cover structure coupled to the substrate and covering a top side of the mounted electronic component, wherein the cover structure is translucent;
   wherein:
      the substrate bottom side covers at least a portion of the dam without an electrical connection between a top side of the dam and the substrate bottom side.

2. The semiconductor device of claim 1, wherein:
   the short interconnects comprise a first short interconnect adjacent a second short interconnect; and
   a distance between the first short interconnect and the dam is greater than a distance between the first short interconnect and the second short interconnect.

3. The semiconductor device of claim 1, wherein:
   a distance between the short interconnects and the dam is greater than a distance between the dam and the tall interconnects.

4. The semiconductor device of claim 1, wherein:
   the short interconnects and the dam comprise a same height.

5. The semiconductor device of claim 1, wherein:
   the short interconnects and the dam comprise conductive tips located on the base electronic component top side; and the short interconnects and the dam comprise a same conductive material that is different than a conductive material of the conductive tips.

6. The semiconductor device of claim 1, further comprising:
a first underfill between the base electronic component and the mounted electronic component;
wherein the first underfill is contained within a perimeter defined by the dam.

7. The semiconductor device of claim 6, further comprising:
a second underfill between the base electronic component and the substrate bottom side;
wherein:
the second underfill contacts at least a lateral portion of the first underfill, a lateral portion of the tall interconnects, and a lateral portion of the dam; and
the second underfill extends between the dam and the substrate bottom side; and
the second underfill is between the top side of the dam and the substrate bottom side.

8. The semiconductor device of claim 1, wherein:
the substrate comprises a cavity inner wall defining the substrate cavity; and
a footprint of the mounted electronic component is closer to the cavity inner wall than to the dam.

9. The semiconductor device of claim 1, further comprising:
a cap structure coupled to the substrate bottom side;
wherein the base electronic component comprises a bottom side and lateral sides enclosed by the cap structure.

10. The semiconductor device of claim 9, further comprising:
a passive component coupled to the substrate bottom side and enclosed by the cap structure.

11. The semiconductor device of claim 1, further comprising:
an external interconnect coupled to the substrate bottom side.

12. The semiconductor device of claim 2, wherein:
the substrate comprises a ledge; and
a perimeter of the cover structure is attached to the ledge.

13. The semiconductor device of claim 12, wherein:
the substrate comprises a cavity inner wall and a cavity outer wall defining the substrate cavity; and
the ledge extends between the cavity inner wall and the cavity outer wall.

14. The semiconductor device of claim 2, wherein:
the cover structure does not protrude past the substrate top side.

15. A semiconductor device comprising:
a base electronic component comprising:
a base electronic component top side;
a substrate comprising:
a substrate bottom side;
conductive pads at the substrate bottom side; and
a substrate cavity;
short interconnects between the base electronic component top side and the substrate bottom side;
a dam bounding a perimeter of the short interconnects; and
tall interconnects adjacent to the dam between the base electronic component top side and the substrate bottom side, and coupled to the conductive pads of the substrate;
a mounted electronic component coupled to the short interconnects, wherein lateral sides of the mounted electronic component are bounded by the substrate cavity;
a first underfill between the base electronic component and the mounted electronic component, wherein the first underfill contacts lateral portions of the short interconnects and the dam; and
a second underfill between the base electronic component and the substrate bottom side, wherein the second underfill contacts the dam and the substrate bottom side, and the second underfill is between a top side of the dam and the substrate bottom side.

16. The semiconductor device of claim 15, wherein:
the second underfill contacts a lateral portion of the tall interconnects and does not contact the short interconnects.

17. A method comprising:
providing a substrate comprising:
a substrate bottom side;
conductive pads at the substrate bottom side; and
a substrate cavity;
coupling a stacked component structure with the substrate, the stacked component structure comprising a base electronic component comprising a base electronic component top side; and
coupling a cover structure to a substrate top and covering the substrate cavity, wherein the cover structure is translucent;
wherein:
short interconnects are between the base electronic component top side and the substrate bottom side;
a dam bounds a perimeter of the short interconnects;
tall interconnects are adjacent to the dam between the base electronic component top side and the substrate bottom side, and coupled to the conductive pads of the substrate;
a mounted electronic component is in the substrate cavity and coupled to the short interconnects; and
the substrate bottom side covers at least a portion of the dam without an electrical connection between a top side of the dam and the substrate bottom side.

18. The method of claim 17, wherein:
the dam comprises conductive tips located opposite the base electronic component top side; and
a conductive material of the dam is different than a conductive material of the conductive tips; and
from the base electronic component top side, a height of the tall interconnects is greater than a height of the conductive tips of the dam.

* * * * *